United States Patent [19]
Twynam

[11] Patent Number: 5,216,538
[45] Date of Patent: Jun. 1, 1993

[54] ELECTRIC-SIGNAL AMPLIFYING DEVICE USING LIGHT TRANSMISSION

[75] Inventor: John K. Twynam, Tenri, Japan
[73] Assignee: Sharp Kabushiki Kaisha, Osaka, Japan
[21] Appl. No.: 731,787
[22] Filed: Jul. 18, 1991
[30] Foreign Application Priority Data
  Jul. 20, 1990 [JP]  Japan .................. 2-193452
[51] Int. Cl.⁵ ............... H01L 29/205; H01L 31/10
[52] U.S. Cl. ................... 359/344; 359/248; 330/59; 257/187; 257/462
[58] Field of Search ........ 357/30, 16, 19, 34; 359/344, 248; 330/59

[56] References Cited
U.S. PATENT DOCUMENTS
3,458,703 7/1969 Migitaka ..................... 359/248

OTHER PUBLICATIONS
*IBM Tech. Discl. Bull.* vol. 12, No. 9, Feb. 1970, p. 1486, Woodall et al.

*Primary Examiner*—Jerome Jackson, Jr.
*Attorney, Agent, or Firm*—David G. Conlin; George W. Neuner

[57] ABSTRACT

An electric-signal amplifying device is provided which includes a light source and an opto-electronic element for amplifying an input signal by use of light emitted from the light source. The opto-electronic element includes a semiconductor substrate and a multi-layered structure disposed thereon. The multi-layered structure has a first semiconductor layer of a first conductivity type, a second semiconductor layer of a second conductivity type, and a third semi-conductor layer of the first conductivity type in this order. The second and third semiconductor layers form a first p-n junction for modulating the amount of light to be absorbed thereinto with a change of bias voltage applied thereto in accordance with the input signal, while the first and second semiconductor layers form a second p-n junction for generating a current as an amplified output signal by absorption of the light transmitted through the first p-n junction. According to the electric-signal amplifying device of this invention, it is possible to amplify an electric signal at a very high speed because minority carriers are not used and the device has a simple structure.

6 Claims, 4 Drawing Sheets

ELECTRIC-SIGNAL AMPLIFYING DEVICE USING LIGHT TRANSMISSION

BACKGROUND OF THE INVENTION

1. Field of the Invention

This invention relates to an electric-signal amplifying device, and more particularly, it relates to a semiconductor device capable of amplifying an electric-signal at a very high speed by use of optical transmission.

2. Description of the Prior Art

FIG. 4 shows a conventional electric-signal amplifying device using optical transmission. This device has a multi-layered structure in which an n+-GaAs sub-collector layer 22, an n-GaAs collector layer 23, a p-AlGaAs base layer 24, a p-GaAs base layer 25, an n-AlGaAs emitter layer 26, and an n+-GaAs sub-emitter layer 27 are formed on a semi-insulating GaAs substrate 21 in this order.

In the production of this device, the above-mentioned layers are successively grown on the semi-insulating GaAs substrate 21, after which mesa etching is performed to remove the layers on part of the p-GaAs base layer 25 and also remove the layers on part of the n+-GaAs sub-collector layer 22. On the exposed surfaces of the p-GaAs base layer 25 and n+-GaAs sub-collector layer 22, a base electrode 29 and a collector electrode 210 are formed in an annular shape, respectively. An emitter electrode 28 is formed on the n+-GaAs sub-emitter layer 27.

FIG. 5 shows energy levels in the layers of the electric-signal amplifying device of FIG. 4 in operation. A power source is connected between the emitter electrode 28 and the collector electrode 210 to apply a voltage $V_{ce}$ to the base-collector junction in the reverse direction. Another power source is connected between the emitter electrode 28 and the base electrode 29 to apply a voltage $V_{be}$ to the emitter-base junction in the forward direction. This results in an emitter current, by which electrons are injected from the n-AlGaAs emitter layer 26 into the p-GaAs base layer 25. The injected electrons recombine with holes in the p-GaAs base layer 25, thereby causing recombination radiation. The light emitted from the p-GaAs base layer 25 is absorbed by charges in the emitter electrode 28 and n+-GaAs sub-collector layer 22, thereby causing excitation which generates electron-hole pairs. The thus generated electrons form an output collector current Ic.

Therefore, a current gain $\beta$ of the conventional electric-signal amplifying device is given by the following expression.

$$\beta = \eta_1\eta_2/(1-\eta_1\eta_2)$$

where $\eta_1$ is the quantum efficiency for the radiative recombination at the emitter-base junction and $\eta_2$ is the quantum efficiency for the light absorption at the base-collector junction.

In the conventional electric-signal amplifying device, an input electric signal is amplified through optical transmission to produce an output electric signal. The light emission in the vicinity of the emitter-base junction is caused by spontaneous recombination through the injection of minority carriers (i.e., electrons) into the p-GaAs base layer 25. However, radiative recombination associated with minority carriers requires a certain period of time. This prohibits a quick response of the device, thereby lowering the operation speed thereof.

SUMMARY OF THE INVENTION

The electric-signal amplifying device of this invention, which overcomes the above-discussed and numerous other disadvantages and deficiencies of the prior art, comprises a light source and an opto-electronic element for amplifying an input signal by use of light emitted from the light source, the opto-electronic element comprising a first p-n junction for modulating the amount of light to be absorbed thereinto with a change of bias voltage applied thereto in accordance with the input signal, and a second p-n junction for generating a current as an amplified output signal by absorption of the light transmitted through the first p-n junction.

In a preferred embodiment, the first and second p-n junctions are respectively connected to a power source for applying a reverse bias voltage thereto.

In a preferred embodiment, the opto-electronic element comprises a semiconductor substrate and a multi-layered structure disposed thereon which has a first semiconductor layer of a first conductivity type, a second semiconductor layer of a second conductivity type, and a third semiconductor layer of the first conductivity type in this order, wherein the second and third semiconductor layers form the first p-n junction, while the first and second semiconductor layers form the second p-n junction. It is more preferred that the first and third semiconductor layers be made of GaAs and the second semiconductor layer be made of AlGaAs.

Thus, the invention described herein makes possible the objective of providing an electric-signal amplifying device using optical transmission which can operate at a very high speed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The electric-signal amplifying device of this invention includes a light source for emitting a predetermined amount of light, and also includes an opto-electronic element having first and second p-n junctions with a band gap corresponding to the wavelength of the light.

The light emitted from the light source is directed into the first p-n junction and partly absorbed thereinto. The first p-n junction operates as a diode for modulating the amount of light to be absorbed thereinto in accordance with an input signal. The light transmitted through the first p-n junction is received by the second p-n junction and absorbed thereinto. The second p-n junction operates as a diode for generating an output signal current by absorption of the light transmitted through the first p-n junction.

For the purpose of attaining more effective operation, the first and second p-n junctions may be formed in a multi-layered structure disposed on a semiconductor substrate. For example, the multi-layered structure has a first semiconductor layer of a first conductivity type, a second semiconductor layer of a second conductivity type, and a third semiconductor layer of the first conductivity type in this order. The first p-n junction is formed between the second and third semiconductor layers, while the second p-n junction is formed between the first and second semiconductor layers.

In other words, the second and third semiconductor layers constitute a diode having the first p-n junction (referred to as a first p-n junction diode), while the first and second semiconductor layers constitute a diode having the second p-n junction (referred to as a second p-n junction diode). The two p-n junction diodes have the second semiconductor layer in common. The first and third semiconductor layers of the same conductivity type are usually made of the same material to form the first and second p-n junctions with a band gap corresponding to the wavelength of the light emitted from the light source.

As can be seen from the above description, in the electric-signal amplifying device of this invention, since light emission by radiative recombination of minority carriers is not used, the amplifying operation can be performed without delay in the signal transmission.

The invention will be further illustrated by reference to the following example.

Figure 1:
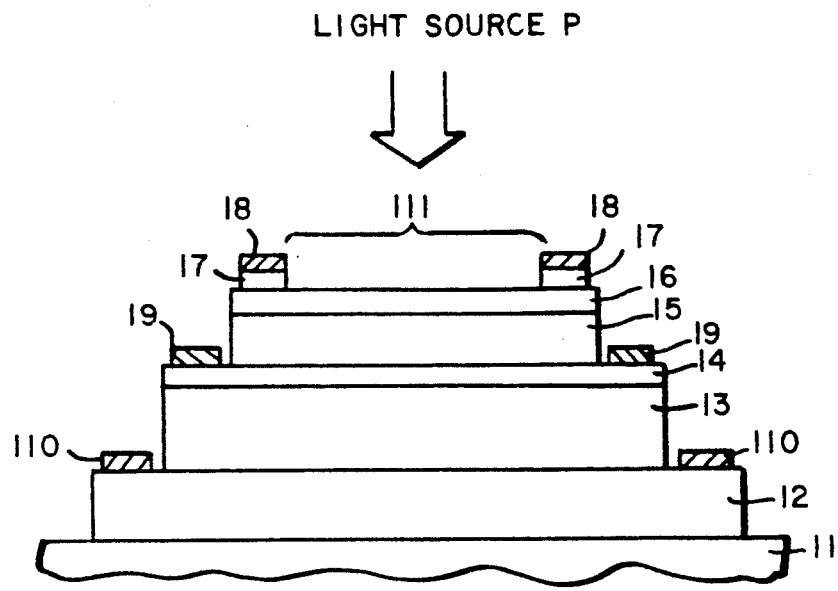
FIG. 1 is a sectional view showing an electric-signal amplifying device according to this invention.

FIG. 1 shows an electric-signal amplifying device of this invention. This electric-signal amplifying device is produced as follows.

Figure 2A:
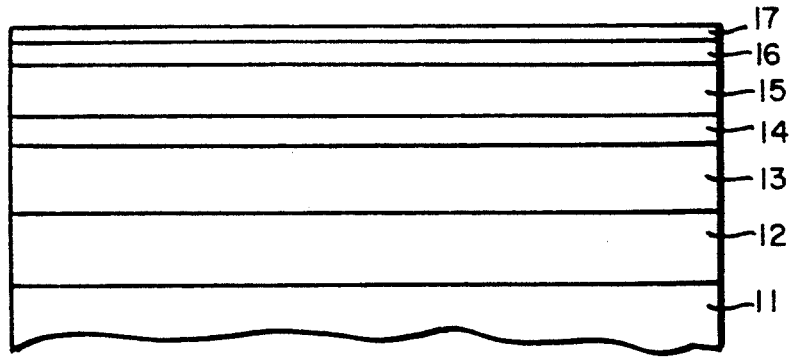
FIGS. 2a to 2d are sectional views showing the production of the electric-signal amplifying device of FIG. 1.

First, as shown in FIG. 2a, on the (100) plane of a semi-insulating GaAs substrate 11, an Si-doped n+GaAs layer 12 (with a dose of $5 \times 10^{18}$ cm$^{-3}$ and a thickness of 0.5 μm), an Si-doped n-GaAs layer 13 (with a dose of $1 \times 10^{16}$ cm$^{-3}$ and a thickness of 0.5 μm), a Be-doped p-AlGaAs layer 14 (with a dose of $1 \times 10^{19}$ cm$^{-3}$ and a thickness of 0.2 μm), an Si-doped n-GaAs layer 15 (with a dose of $1 \times 10^{16}$ cm$^{-3}$ and a thickness of 0.3 μm), an Si-doped n-AlGaAs layer 16 (with a dose of $1 \times 10^{17}$ cm$^{-3}$ and a thickness of 0.2 μm), and an Si-doped n+-GaAs layer 17 (with a dose of $5 \times 10^{18}$ cm$^{-3}$ and a thickness of 0.1 μm) are successively grown in this order by molecular beam epitaxy or metal organic chemical vapor deposition.

Figure 2B:
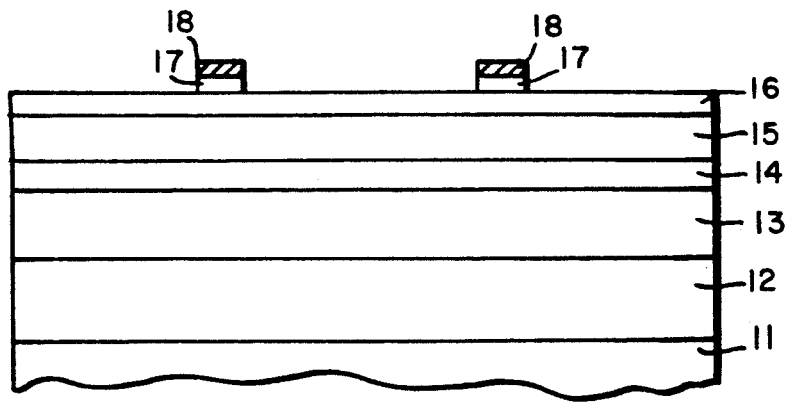

Next, a gate electrode 18 is formed on the n+-GaAs layer 17 by the lift-off method. The gate electrode 18 is provided with an entrance window 111 (see FIG. 1), through which light P emitted from a light source (not shown) passes. Using the gate electrode 18 as a mask, part of the n+-GaAs layer 17 is removed by etching, as shown in FIG. 2b.

Figure 2C:
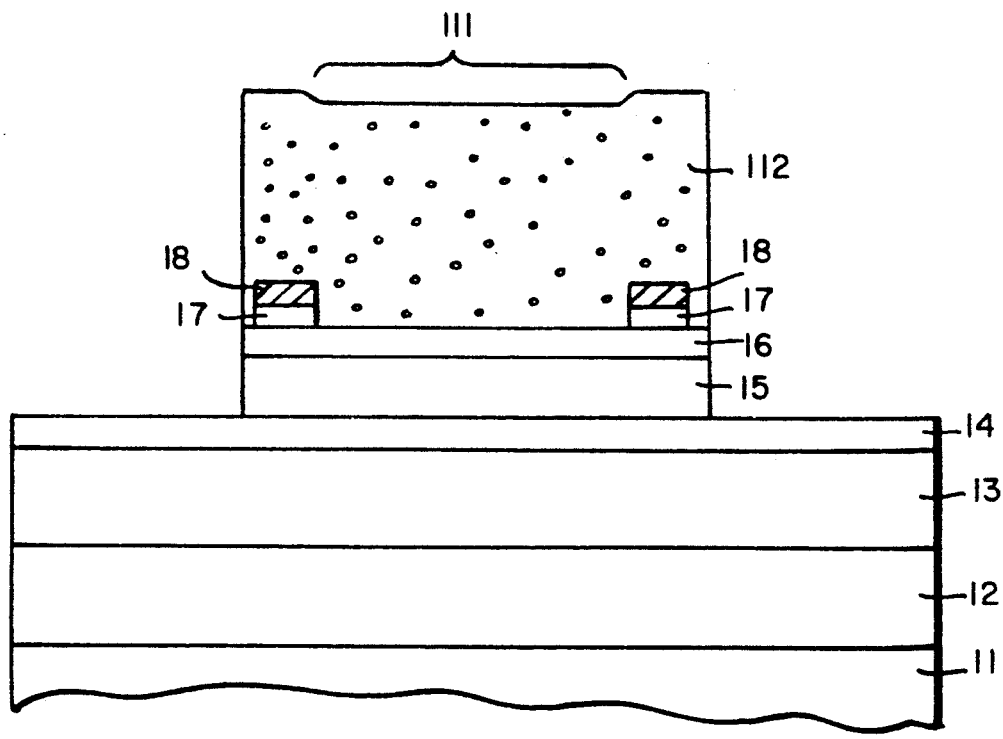

A photoresist 112 is formed so as to cover the gate electrode 18, n+-GaAs layer 17, and the portion of the n-AlGaAs layer 16 which is positioned near the gate electrode 18 and under the entrance window 111 of the gate electrode 18. Using the photoresist 112 as a mask, part of the n-AlGaAs layer 16 and n-GaAs layer 15 is removed by mesa etching to expose the surface of the corresponding portion of the p-AlGaAs layer 14, as shown in FIG. 2c. The photoresist 112 is then removed. On the exposed surface of the p-AlGaAs layer 14, an annular common electrode 19 is formed from an Au-Zn ohmic metal by the lift-off method.

Figure 2D:
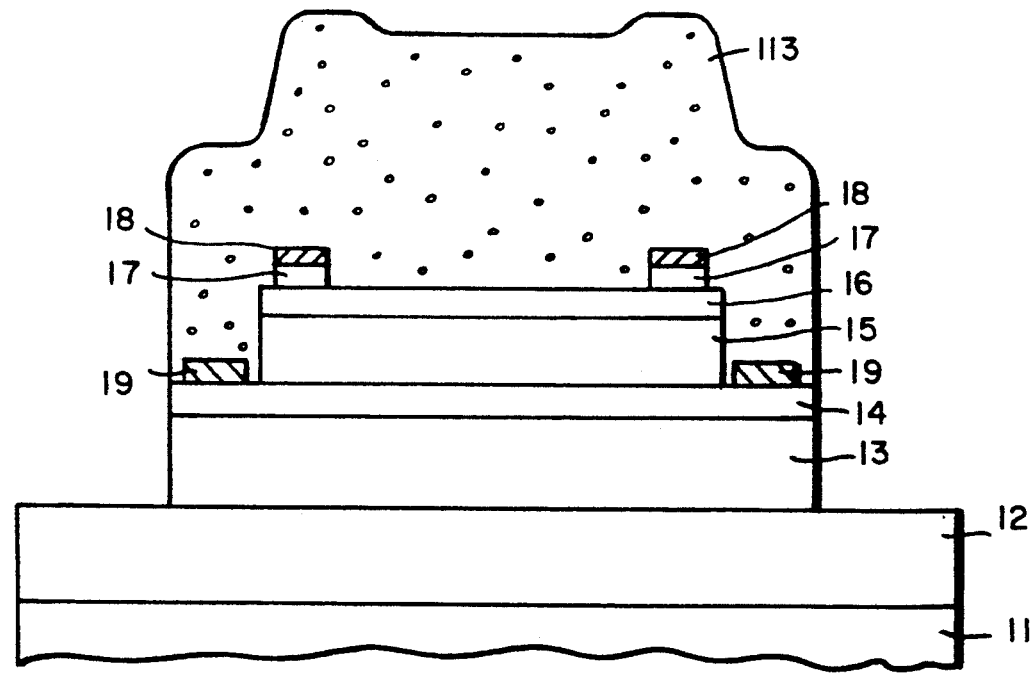

Then, a photoresist 113 is formed so as to cover the gate electrode 18, n+-GaAs layer 17, n-AlGaAs layer 16, n-GaAs layer 15, common electrode 19, and the portion of the p-AlGaAs layer 14 which is positioned near the common electrode 19. Using the photoresist 113 as a mask, part of the p-AlGaAs layer 14 and n-GaAs layer 13 is removed by mesa etching to expose the surface of the corresponding portion of the n+-GaAs layer 12, as shown in FIG. 2d. The photoresist 113 is then removed. On the exposed surface of the n+-GaAs layer 12, an annular collector electrode 110 is formed from an Au-Ge ohmic metal by the lift-off method.

Finally, another photoresist is formed so as to cover the gate electrode 18, n+-GaAs layer 17, n-AlGaAs layer 16, n-GaAs layer 15, common electrode 19, p-AlGaAs layer 14, n-GaAs layer 13, collector electrode 110, and the portion of the n+-GaAs layer 12 which is positioned near the collector electrode 110. Using this photoresist as a mask, the portion of the n+-GaAs layer 12 which is not covered with the photoresist is removed by mesa etching to expose the surface of the corresponding portion of the semi-insulating GaAs substrate 11. As a result, an electric-signal amplifying device as shown in FIG. 1 is obtained.

In the electric-signal amplifying device thus produced, the p-AlGaAs layer 14 and the n-GaAs layer 15 constitute the first p-n junction diode, while the n-GaAs layer 13 and the p-AlGaAs layer 14 constitute the second p-n junction diode. The first and second p-n junction diodes have the p-AlGaAs layer 14 in common.

Since the gate electrode 18 is provided with the entrance window 111 as described above, the light P can readily be directed into the first p-n junction diode. The n+-GaAs layer 17 is in the same shape as the gate electrode 18 so as not to absorb the light P. The n+-GaAs layer 17 functions as a contact layer for reducing the ohmic resistance between the common electrode 19 and the n-AlGaAs layer 16. Also, both the collector electrode 110 and the common electrode 19 are in an annular shape as described above, so that the light P can readily pass through the first p-n junction diode and enter the second p-n junction diode.

The n-GaAs layer 15 of the first p-n junction diode and the n-GaAs layer 13 of the second p-n junction diode both have a band gap corresponding to the wavelength of the light P emitted from the light source.

Since the n-AlGaAs layer 16 has a large band gap, the amount of light absorbed into the n-AlGaAs layer 16 is small. This allows the n-GaAs layer 15 with a depletion layer to receive a large amount of light. Also because the p-AlGaAs layer 14 has a large band gap, the amount of light absorbed into the p-AlGaAs layer 14 is small, thereby allowing the n-GaAs layer 13 of the second p-n junction diode to receive a large amount of light.

The above-described electric-signal amplifying device has an n-p-n structure which is composed of a p-type semiconductor layer interposed between the two n-type semiconductor layers. Alternatively, the electric-signal amplifying device of this invention may have a p-n-p structure which is composed of an n-type semiconductor layer interposed between the two p-type semiconductor layers.

The electric-signal amplifying device described above receives the light P which is directed perpendicular thereto. However, the light P may be allowed to enter the electric-signal amplifying device from other directions.

The operation of the electric-signal amplifying device according to this invention will now be described with reference to FIGS. 3a and 3b.

Figure 3A:
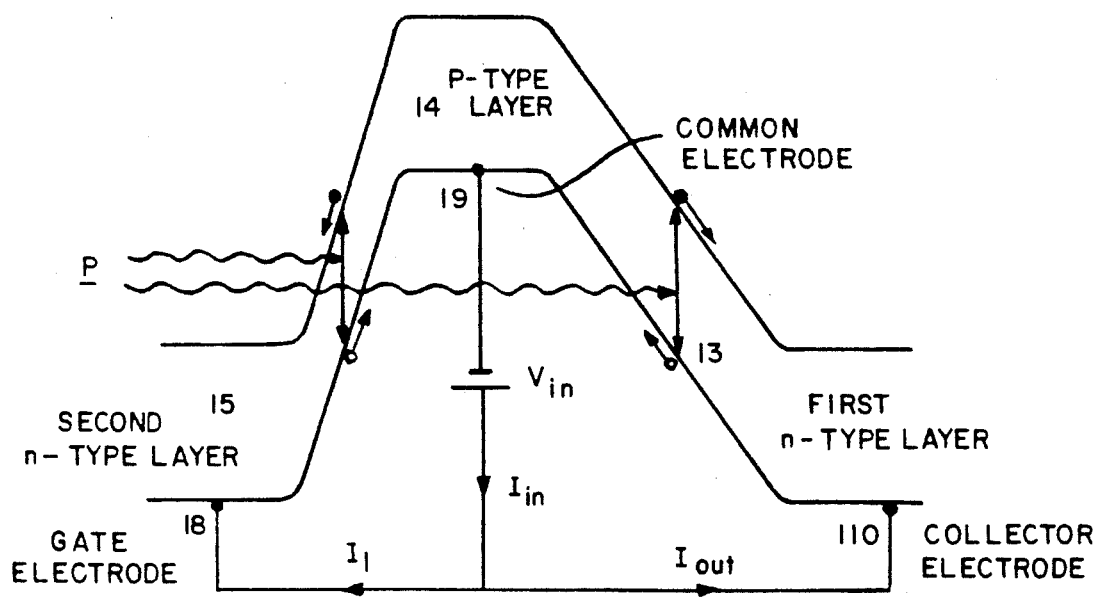
FIG. 3a is a diagram showing energy levels in the layers of the electric-signal amplifying device of FIG. 1 in operation.

FIG. 3a shows energy levels in the layers of the electric-signal amplifying device of FIG. 1 in operation. As shown in this figure, both the first and second p-n junction diodes are biased in the reverse direction by use of a power source (input voltage $V_{in}$). In this state, the first p-n junction diode receives the light P from the light source. The first p-n junction diode functions as an optical modulation diode for changing the amount of light passing therethrough in accordance with the applied bias voltage by using the Franz-Keldysh effect.

While the light P is being transmitted through the first p-n junction diode, a portion of light is absorbed into the n-GaAs layer 15. The amount of light to be absorbed is determined in accordance with the bias voltage applied to this diode. The other portion of light which has not been absorbed into the first p-n junction diode is allowed to enter the second p-n junction diode. The second p-n junction diode functions as a light-receiving diode which absorbs most of the light coming thereinto so as to generate an output current. The level of current to be generated by the second p-n junction diode is determined in accordance with the amount of light absorbed. The thickness of each layer in the second p-n junction diode is set in such a manner that the incident light can be efficiently converted into the current.

Figure 3B:
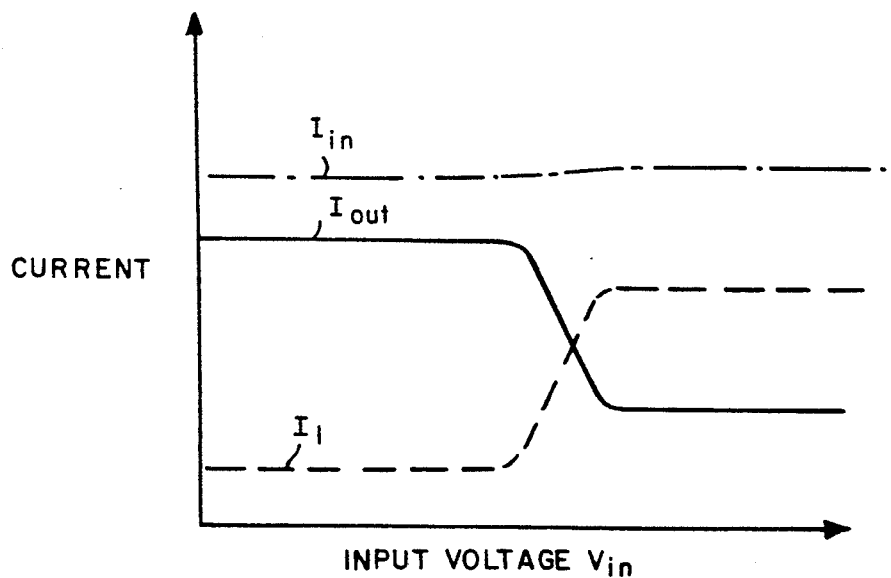
FIG. 3b is a graph showing the relationship between the input voltage and the currents in the diodes of the electric-signal amplifying device of FIG. 1.
Figure 4:
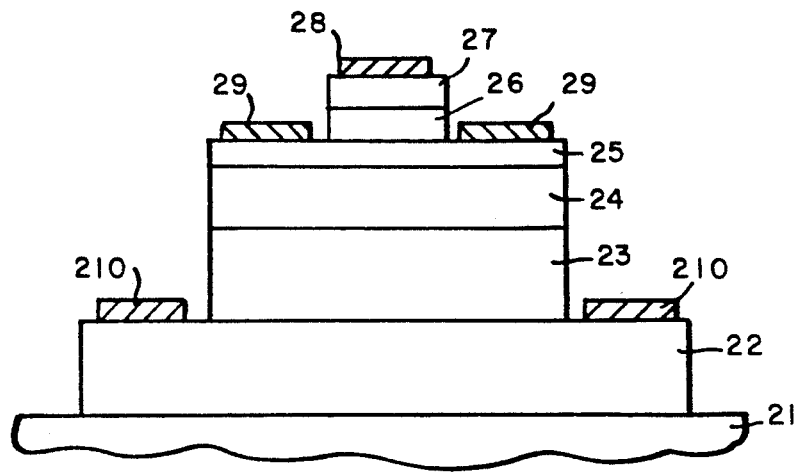
FIG. 4 is a sectional view showing a conventional electric-signal amplifying device.
Figure 5:
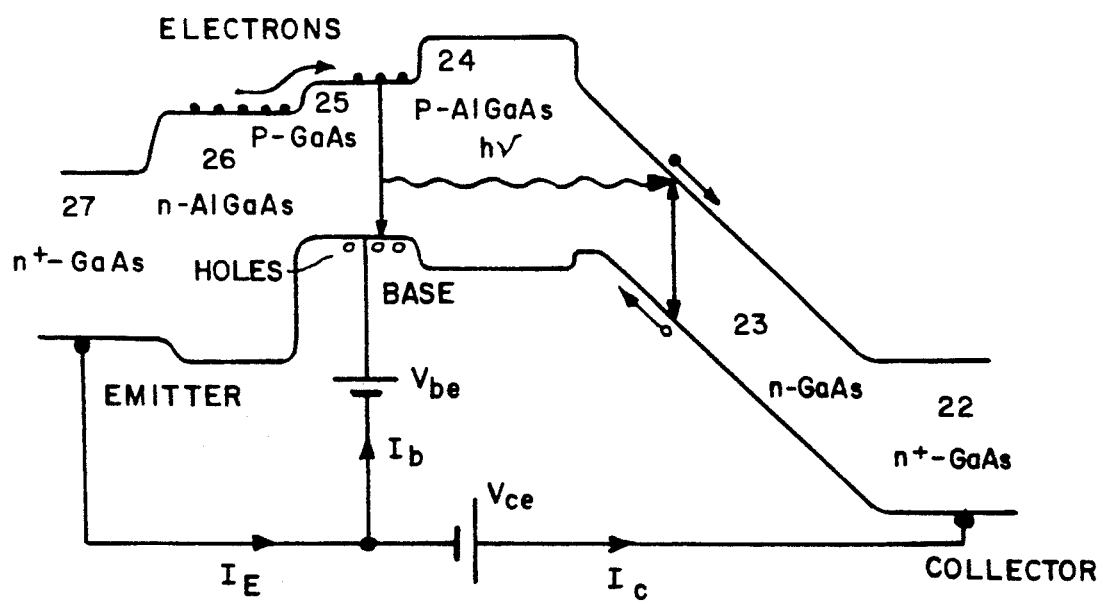
FIG. 5 is a diagram showing the energy levels in the layers of the electric-signal amplifying device of FIG. 4 in operation.

FIG. 3b is a graph showing the variations in the current $I_1$ flowing through the first p-n junction diode and the current $I_{out}$ flowing through the second p-n junction diode, when the input voltage $V_{in}$ is applied to these p-n junction diodes, as well as the level of the current $I_{in}$ which is the sum of the currents $I_1$ and $I_{out}$.

As can be seen from this figure, when the input voltage $V_{in}$ is changed to increase the current $I_1$ flowing through the first p-n junction diode, the current $I_{out}$ flowing through the second p-n junction diode decreases. Conversely, when the current $I_1$ is decreased, the current $I_{out}$ increases. This relationship is utilized in the operation of the electric-signal amplifying device of this invention.

The current $I_1$ flowing through the first p-n junction diode is given by the following expression.

$$I_1 = \alpha_1 P q / h\nu \quad (1)$$

where $\alpha_1$ is the fraction of incident light absorbed in the first p-n junction diode, P is the incident light power, q is the unit charge, $\nu$ is the frequency of the incident light, and h is Plank's constant.

The current $I_{out}$ flowing through the second p-n junction diode is given by the following expression.

$$I_{out} = \alpha_2(1-\alpha_1) P q / h\nu \quad (2)$$

where $\alpha_2$ is the fraction of incident light absorbed in the second p-n junction diode.

From these expressions, the current $I_{in}$ is given by the following expression.

$$\begin{aligned} I_{in} &= I_1 + I_{out} \\ &= \{\alpha_1(1-\alpha_2) + \alpha_2\} P q / h\nu \end{aligned} \quad (3)$$

Thus, the differential current gain G can be obtained by the following expression.

$$\begin{aligned} G &= d(I_{out})/d(I_{in}) \\ &= -\alpha_2/(1-\alpha_2) \end{aligned} \quad (4)$$

As can be seen from this expression, the differential current gain G can be improved by selecting the wavelength of light corresponding to the band gap of the p-n junction diodes, and also by appropriately selecting the crystallinity and arrangement of the respective layers of the electric-signal amplifying device.

The electric-signal amplifying device of this invention has a simple structure because the second semiconductor layer is common to the two p-n junction diodes. Moreover, no minority carriers are used for the amplifying operation. Thus, the electric-signal amplifying device of this invention can operate at a very high speed.

It is understood that various other modification will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An electric-signal amplifying device comprising a light source and an opto-electronic element for amplifying an input signal by use of light emitted from the light source, the opto-electronic element comprising a GaAs and AlGaAs first p-n junction and means for modulating the amount of light to be absorbed by the first p-n junction by changing a bias voltage applied thereto in accordance with the input signal, and a GaAs and AlGaAs second p-n junction and bias means for applying a bias voltage thereto, the second p-n junction and bias means generating a current as an amplified output signal as a function of absorption of the light transmitted through the first p-n junction.

2. An electric-signal amplifying device according to claim 1, wherein the opto-electronic element comprises a semiconductor substrate and a multi-layered structure disposed thereon which has a first semiconductor layer of a first conductivity type, a second semiconductor layer of a second conductivity type, and a third semiconductor layer of the first conductivity type in this order, wherein the second and third semiconductor layers form the first p-n junction, while the first and second semiconductor layers form the second p-n junction.

3. An electric-signal amplifying device according to claim 2, wherein the first and third semiconductor layers are made of GaAs and the second semiconductor layer is made of AlGaAs.

4. An electric-signal amplifying device according to claim 1, wherein the first and second p-n junctions are respectively connected to a power source for applying a reverse bias voltage thereto.

5. An opto-electric device for amplifying an input signal comprising:

a multi-layered structure having a first semiconductor layer of a first conductivity type, a second semiconductor layer of a second conductivity type, and a third semiconductor layer of the first conductivity type in that order, the second and third semiconductor layers forming a first p-n junction and the first and second layers forming a second p-n junction;

light source means for transmitting light through the first p-n junction, the first p-n junction absorbing a portion of the light and transmitting another portion of the light through to the second p-n junction;

bias means for providing a bias voltage to the first p-n junction as a function of the input signal to control a ratio of the absorbed portion to the transmitted portion; and output means coupled to the second p-n junction for providing an output signal as a function of the portion of light transmitted through to the second p-n junction;

wherein the multi-layered structure further includes a light entrance window at a surface of the third semiconductor layer for receiving light transmitted from the light source means, the light source means being physically separate from the multi-layered structure; and wherein the first and third semiconductor layers are made of GaAs and the second semiconductor layer is made of AlGaAs.

6. The opto-electronic device of claim 5, wherein the light entrance window comprises a fourth semiconductor layer of the first conductivity type, the fourth semiconductor layer having a large band gap to minimize absorption of light thereby, and further wherein the bias means comprises a gate electrode coupled to the fourth semiconductor layer.

* * * * *